(12) United States Patent
Ramachandran et al.

(10) Patent No.: US 7,966,593 B1
(45) Date of Patent: Jun. 21, 2011

(54) INTEGRATED CIRCUIT DESIGN SYSTEM, METHOD, AND COMPUTER PROGRAM PRODUCT THAT TAKES INTO ACCOUNT THE STABILITY OF VARIOUS DESIGN SIGNALS

(75) Inventors: Venky Ramachandran, Cupertino, CA (US); Nikhil Tripathi, Noida (IN); Anmol Mathur, San Jose, CA (US); Sumit Roy, San Jose, CA (US); Malay Haldar, Noida (IN)

(73) Assignee: Calypto Design Systems, Inc., Santa Clara, CA (US)

( * ) Notice: Subject to any disclaimer, the term of this patent is extended or adjusted under 35 U.S.C. 154(b) by 550 days.

(21) Appl. No.: 11/832,443

(22) Filed: Aug. 1, 2007

(51) Int. Cl.
*G06F 17/50* (2006.01)
(52) U.S. Cl. .................. 716/109; 716/108; 716/133
(58) Field of Classification Search .................. None
See application file for complete search history.

(56) References Cited

U.S. PATENT DOCUMENTS 7,761,827 B1    7/2010 Ramachandran et al.

OTHER PUBLICATIONS

Alidina et al., "Precomputation-Based Sequential Logic Optimization for Low Power", IEEE Trans. on VLSI Systems, vol. 2, No. 4, Dec. 1994, pp. 426-436.*
Raghavan et al., "Automatic Insertion of Gated Clocks at Register Transfer Level", 1999 Proc. Twelfth Int'l Conference on VLSI Design, pp. 48-54.*
Roy et al., "Resynthesis of Sequential Circuits for Low Power", 1998 IEEE, pp. 57-61.*
Farrahi et al., "Memory Segmentation to Exploit Sleep Mode Operation", 1995 $32^{nd}$ ACM/IEEE Design Automation Conference, 6 pages.*
Tellez et al., "Activity-Driven Clock Design for Low Power Circuits," 1995 IEEE, pp. 62-65.*
Benini et al., "Saving Power by Synthesizing Gated Clocks for Sequential Circuits", IEEE Design & Test of Computers, Winter 1994, pp. 32-41.*
Benini et al., "Automatic Synthesis of Low-Power Gated-Clock Finite-State Machines", IEEE Trans. on CAD of ICs and Systems, col. 15, No. 6, Jun. 1996, pp. 630-643.*
Babighian et al., "A Scalable Algorithm for RTL Insertion of Gated Clocks Based on ODCs Computation," IEEE Trans. on CAD of ICs & Systems, vol. 24, No. 1, Jan. 2005, pp. 29-42.*
Benini et al., "Symbolic Synthesis of Clock-Gating Logic for Power Optimization of Synchronous Controllers," ACM Trans. on Design Automation of Electronic Systems, vol. 4, No. 4, Oct. 1999, pp. 351-375.*
Wu et al., "Clock-Gating and Its Application to Low Power Design of Sequential Circuits," IEEE Trans. on Circuits and Systems—I: Fundamental Theory and Applications, vol. 47, No. 103, Mar. 2000, pp. 415-420.*
U.S. Appl. No. 11/832,425, filed Aug. 1, 2007.

* cited by examiner

*Primary Examiner* — Leigh Marie Garbowski
(74) *Attorney, Agent, or Firm* — Zilka-Kotab, PC

(57) ABSTRACT

An integrated circuit design system, method, and computer program product are provided that takes into account signal stability. In use, at least one condition is identified where an output of a logic element before receipt of a clock signal is the same as the output of the logic element after receipt of the clock signal. To this end, such logic element may be disabled based on the identified condition for power savings or other purposes.

23 Claims, 9 Drawing Sheets

INTEGRATED CIRCUIT DESIGN SYSTEM, METHOD, AND COMPUTER PROGRAM PRODUCT THAT TAKES INTO ACCOUNT THE STABILITY OF VARIOUS DESIGN SIGNALS

FIELD OF THE INVENTION

The present invention relates to systems for designing integrate circuits, and more particularly to optimizing integrated circuit design.

BACKGROUND

One objective when designing integrated circuits involves the reduction of necessary power consumption by the resultant design. During use, various logic elements such as flip flops, etc. require power each time they are switched at each clock cycle. There is thus a desire to disable such logic when, of course, it does not impact the desired functionality of the integrated circuit design.

However, such task of determining when different logic can be disabled can be problematic. For example, additional logic is often required to determine the conditions in which such disabling is appropriate. In some cases, power consumption of such additional logic, can require more power than the original integrated circuit design.

There is thus a need for addressing these and/or other issues associated with the prior art.

SUMMARY

An integrated circuit design system, method, and computer program product are provided that takes into account signal stability. In use, at least one condition is identified where an output of a logic element before receipt of a clock signal is the same as the output of the logic element after receipt of the clock signal. To this end, such logic element may be disabled based on the identified condition for power savings or other purposes.

DETAILED DESCRIPTION

Figure 1:
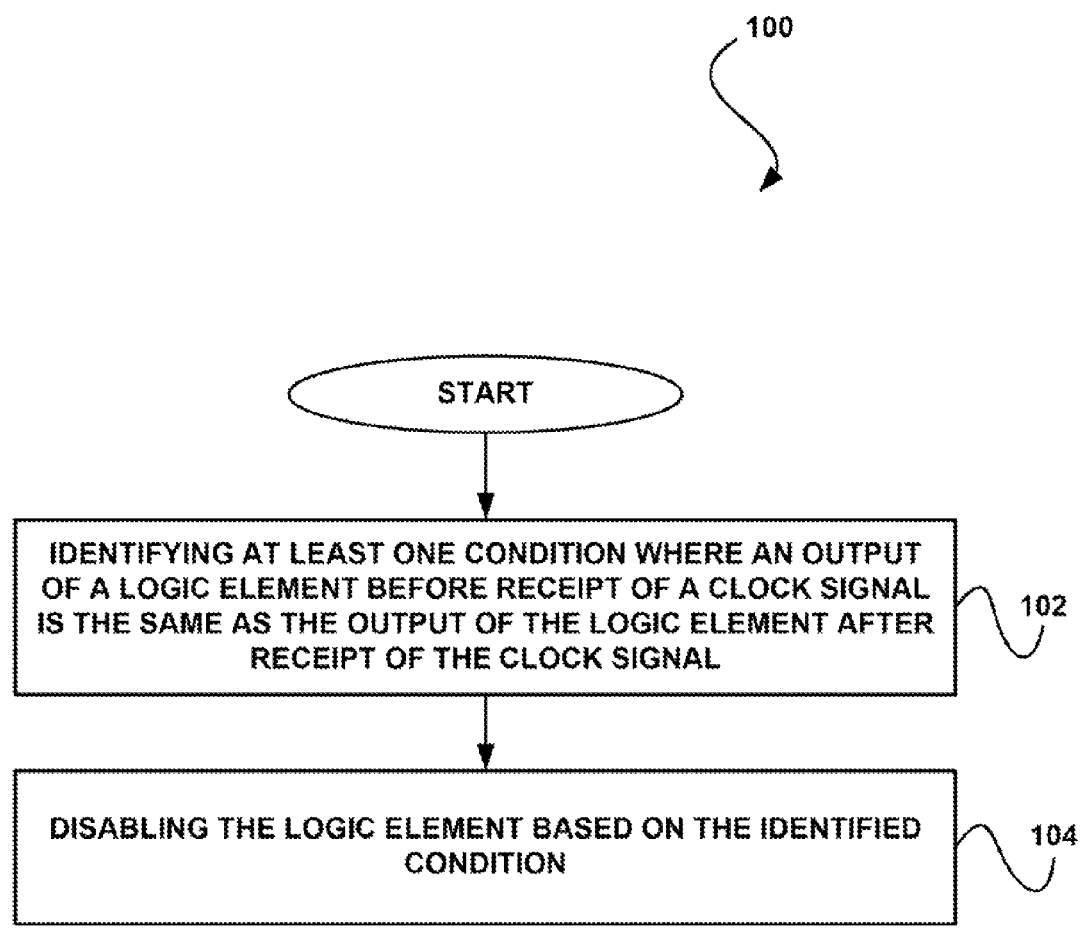
FIG. 1 shows a method for designing integrated circuits by taking into account signal stability, in accordance with one embodiment.

FIG. 1 shows a method 100 for designing integrated circuits by taking into account signal stability, in accordance with one embodiment. As shown in operation 102, at least one condition is identified where an output of a logic element before receipt of a clock signal is the same as the output of the logic element after receipt of the clock signal. In one embodiment, such condition(s) may be identified as a potential opportunity to disable the logic element, while not necessarily affecting the functionality of the resultant integrated circuit design.

In the context of the present description, the foregoing logic element may refer to any sequential element in a circuit. Just by way of example, in various exemplary embodiments, the logic, element may refer to a single flip flop, a register bank that includes multiple flip-flops, a memory element (e.g. that is always written into every clock cycle), etc. As mentioned earlier, during use, such logic elements may operate such that, under certain conditions, the output of the logic element before receipt of a clock signal is the same as the output of the logic element after receipt of the clock signal.

To this end, such logic element may be disabled based on the identified condition for power savings or other purposes. See operation 104. In the context of the present description, such disabling may include any design consideration, operation, and or anything else that results in the logic element requiring less power during use of the associated integrated circuit. For example, in one embodiment, such disabling may include simply refraining from clocking the particular logic element when the condition indicates that the power savings is available, while not necessarily affecting the functionality of the resultant integrated circuit.

In one embodiment the condition may reflect a situation where an input of the logic element remains unchanged for a first clock cycle and a subsequent second clock cycle, or optionally any number of subsequent clock cycles. For instance, the input may be "stable" or "constant" over at least two clock cycles. As an option, the input may be written to the logic element during the first clock cycle. Further, in such embodiment, the logic element may be disabled during the subsequent second or more clock cycles where the condition exists.

In the context of a specific example involving an "always enabled" flip flop logic element, a situation may be considered where the input is stable (e.g. the input is "1" over a string of consecutive clock cycles, etc.). In use, it may then be assumed that, after the flip flop has been written at least once, the output will remain the same after being consecutively clocked. Since, in such case, no change is made in the output (and thus the output would not necessarily affect the functionality of the resultant integrated circuit design), such situation may be exploited for power savings purposes.

Of course, other embodiments are also considered where other types of flip flop logic elements (e.g. conditionally enabled flip flops, etc.) are involved. In such embodiment, a condition may be identified where a data input of the logic element remains unchanged between a first clock cycle and a subsequent second or more clock cycles. In such embodiment, the logic element may be disabled during a subsequent second clock cycle in response to a determination that a stable value presented in the first clock cycle has been captured (i.e. that a pre-existing enable input signal on the flop that controls when data is written into the logic element was true).

In a similar embodiment, such condition may involve one where the exact value of the stable input is known. For example, this may be a result of generating conditions when known constants may be utilized to ensure that a known value has been captured.

More illustrative information will now be set forth regarding various optional architectures and uses in which the foregoing method may or may not be implemented, per the desires of the user. For example, the conditions may be propagated from a plurality of outputs to a plurality of inputs. As an option, the conditions may be propagated from the outputs to the inputs utilizing topological ordering. Such topological ordering may include a linear ordering of a plurality of nodes based on connections there between. For example, a first node (e.g. logical element) with connections to multiple other nodes may be first in the order (i.e. before the other nodes). To this end in various embodiments, iterative propagation of input stability expressions may be carried out utilizing topological ordering.

In another embodiment, reset requirements may be provided for any additional flip flops that are introduced to capture Boolean stability conditions. This may ensure that the value dump of the design coming out of reset is identical in both an original and optimized situation.

In yet another embodiment, at least one condition may be identified where an input of a logic element before receipt of a clock signal is a known constant value and is the same as the output of the logic element during receipt of the clock signal. In addition, the logic element may be disabled based on the identified condition.

These and other features will now be described in more detail. It should be strongly noted, however, that the following information is set forth for illustrative purposes and should not be construed as limiting in any manner. Any of the following features may be optionally incorporated with or without the exclusion of other features described.

Figure 2A:
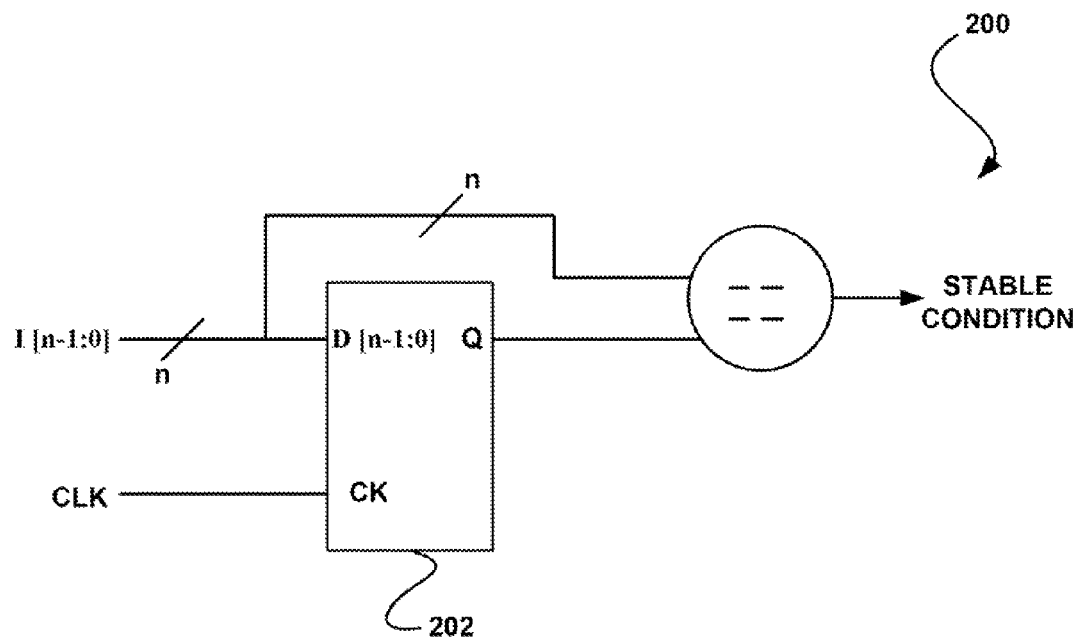
FIG. 2A shows a system for identifying a stable condition of an input signal, in accordance with another embodiment.

FIG. 2A shows a system 200 for identifying a stable condition of an input signal, in accordance with another embodiment. As an option, the system 200 may be implemented in the context of the details of FIG. 1. Of course, however, the system 200 may be implemented in any desired environment. Further, the aforementioned definitions may equally apply to the description below.

As shown, stability for an input "I" may be identified with respect to a register 202. In the context of the present embodiment, an input signal may be considered to be stable if it is capable of maintaining the same value (e.g. binary value, etc.) across two consecutive clock cycles. For example, constant input signals are stable by definition, in one embodiment. Outputs of flip flops with enable or load signals may also be considered to be stable when the flip flop is not written into (or enabled) in a previous clock cycle.

In one embodiment, additional hardware may be utilized to identify stability of input signals by saving a state of an input signal in a first cycle and comparing such state with a subsequent state of a signal in a subsequent second or more cycles. Table #1 illustrates one example code capable of being utilized to identify stability of an input signal. The code in the present example, and any other examples provided herein, are written in Verilog®. Of course, it should be noted that the code may be written utilizing any desired coding language.

TABLE #1

//Let I be a signal for which stability is identified
always @(posedge clk)
    Iflop <= I; // Iflop is the capture flop that records the previous
//clock cycle value of I
assign stableCond = (I == Iflop);

As shown in Table #1, for each positive edge of a clock cycle (posedge clk), the value of an input signal (I) may be identified. In addition, it may be determined whether the output signal is stable if a stored value of a previous input signal (Iflop) is equal to the identified value of the input signal (I).

Figure 2B:
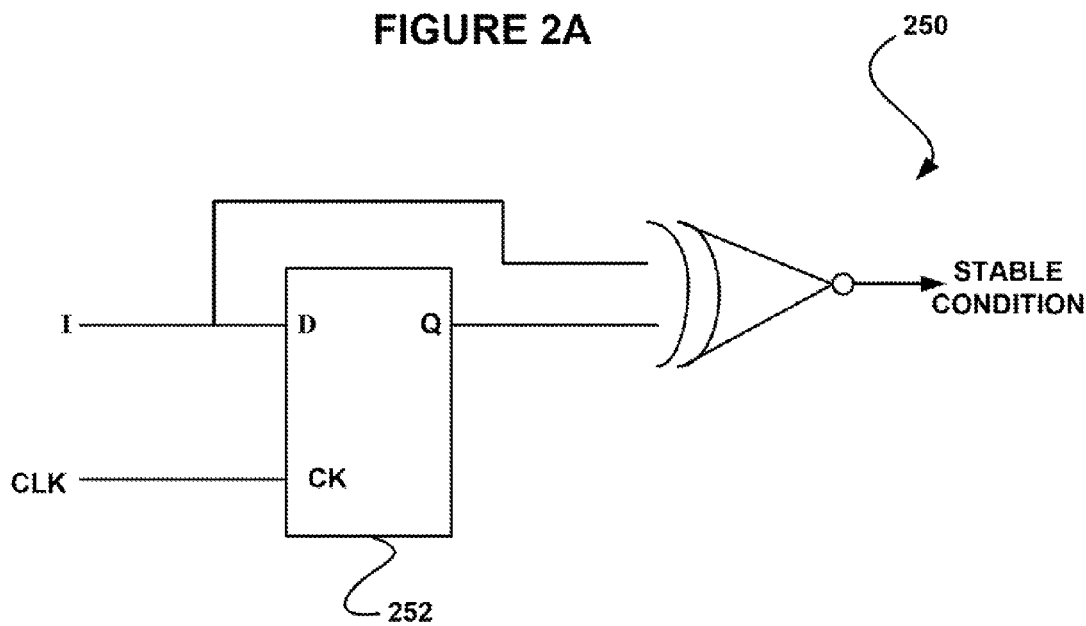
FIG. 2B shows a system for identifying a stable condition of a single bit input signal, in accordance with yet another embodiment.

FIG. 2B shows a system 250 for identifying a stable condition of a single bit input, signal, in accordance with yet another embodiment. As an option, the system 250 may be implemented in the context of the details of FIG. 1. Of course, however, the system 250 may be implemented in any desired environment. Further, the aforementioned definitions may equally apply to the description below.

As shown, stability of a single bit input signal "I" across a flip flop 252 may be identified utilizing an XNOR gate. As shown the \NOR gate may receive and store a single bit input signal ("I") associated with a first clock signal, and may further receive and store a single bit input signal ("I") associated with a subsequent second clock signal. In this way, a stability of the input signals may be identified utilizing the XNOR gate. Table #2 illustrates code capable of being utilized to identify a stable condition of a single bit input signal. Of course, it should be noted that such code is set forth for illustrative purposes only, and thus should not be construed as limiting in any manner.

TABLE #2 stableCond = (I .xnor. Iflop)

Figure 3A:
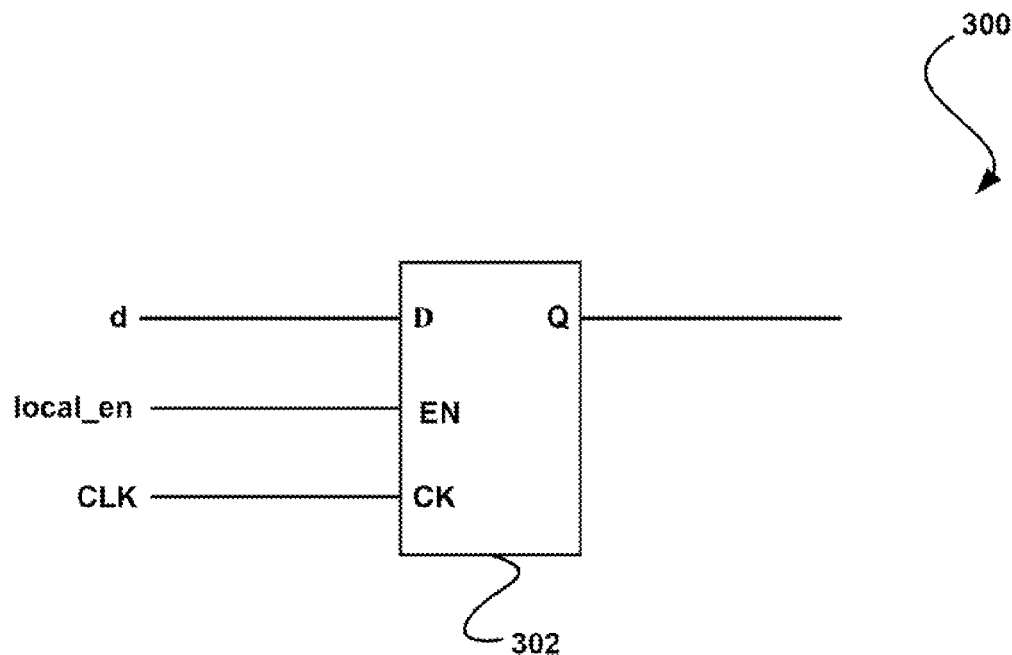
FIG. 3A shows a system in which a register is conditionally enabled based on the value of the signal local_en, in accordance with another embodiment.

FIG. 3A shows a system 300 in which a register is conditionally enabled based on the value of the signal local_en, in accordance with another embodiment. As an option, the system 300 may be implemented in the context of the details of FIGS. 1-2B. Of course, however, the system 300 may be implemented in any desired environment. Further, the aforementioned definitions may equally apply to the description below.

As shown, the register 302 may be considered to be enabled when a value is capable of being written to it during a particular clock cycle. As shown, the register 302 is enabled (e.g. loads a new value) only when the signal local_en is high. To this end, in the context of the present embodiment, the register 302 will may be referred to as a conditionally enabled register. It should be noted that, if local_en is always high or is a constant value of "1," then the register 302 becomes an unconditionally, or always, enabled register in one embodiment. In the present embodiment, if a value is written to the register 302 during each clock cycle, the register 302 is considered to be always enabled.

In one embodiment, such register 302 is a state-holding device of an integrated circuit. Further, in situations where a current input data value is the same as a previous input data value written into the register 302, such a write may be identified as redundant. It such situations, the loading of the register 302 may be prevented, or disabled with respect to the current clock cycle. With respect to the embodiment where the register 302 includes the conditionally enabled register, the condition of such persistent stability may be equivalent to the condition when the input signal of the register 302 is also stable, as described above with respect to FIGS. 2A-B.

Figure 3B:
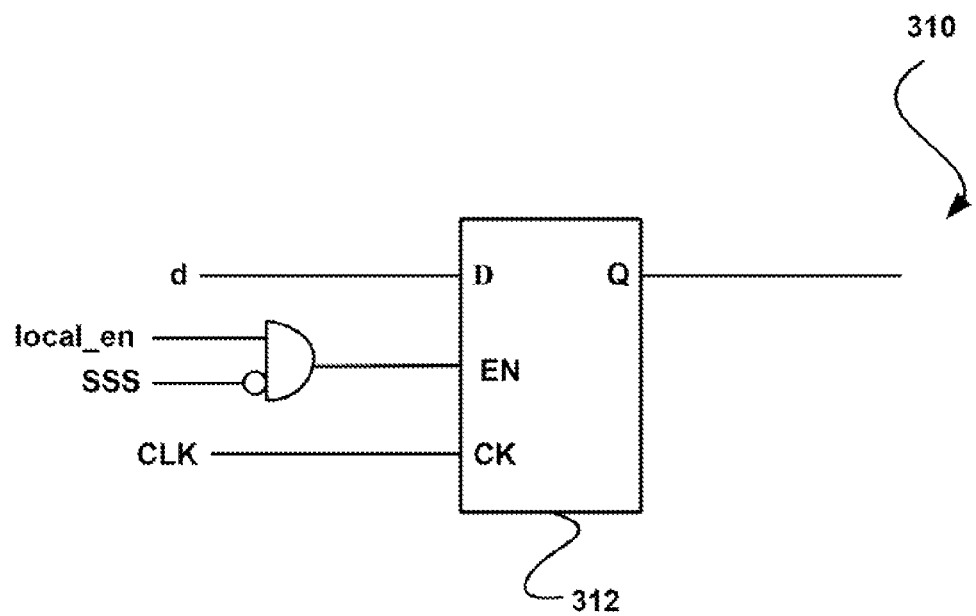
FIG. 3B shows a system in which a register is additionally disabled based on identifying a stability-based enable signal SSS, in accordance with another embodiment.
Figure 3C:
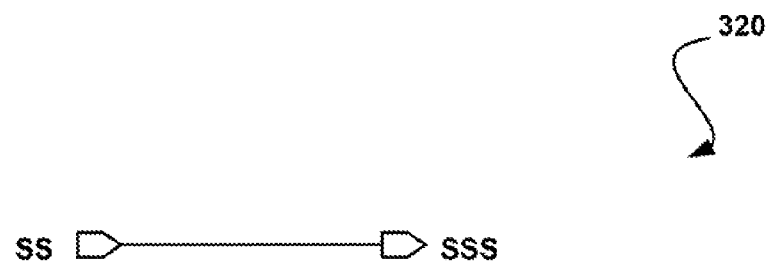
FIG. 3C shows a system for generating a stability-based enable signal SSS for an always enabled register based on the stable condition SS of its data input, in accordance with yet another embodiment.

FIG. 3B shows a system 310 in which a register is additionally disabled based on identifying a stability-based enable signal "SSS," in accordance with another embodiment. As an option, the system 310 may be implemented in the context of the details of FIGS. 1-3A. Of course, however, the system 310 may be implemented in any desired environment. Further, the aforementioned definitions may equally apply to the description below.

In one embodiment, the register 312 may already be enabled. However, solely identifying the stability of the input signal may be insufficient since the register 312 may not have been necessarily enabled during a previous clock cycle associated with the same data value. Thus, it may be necessary to not only ensure that the inputted data values are stable, but further that the value has been captured. Depending on the Boolean relationships that exist between stability conditions and local enable signals, various structures are possible that can provide functionally correct additional gating for the register 312.

Table #3 illustrates one example of code with which a stable condition "SS" is identified utilizing a data input stability condition of an input signal of a register "F," and which can be used to provide additional gating. As shown in Table #3, "F" is originally already conditionally enabled by a signal local_en. Further, in the case when the condition "SS" is true, it is logically implied that local_en will be true, or in the case when "SS" is false, it is logically implied that local_en is true. In this way, the transformation set forth in Table #3 holds. Again, it should be noted that such code is set forth for illustrative purposes only, and thus should note be construed as limiting in any manner.

TABLE #3

```
always @(posedge clk)
  if (local_en)
    F <= F.d
Can be transformed to
always @(posedge clk)
  if (local_en && !SSS)
    F <= F.d
assign SSS = SS;
```

As shown in Table #3, an additional signal "SSS" may limit the number of clock cycles for which the register 312 is loaded, thus strengthening the enable of the register 312. In other words, loading of the register 312 may be limited, such that it is only loaded when the register 312 is enabled and the input, signal is not stable, thus providing power savings. As also shown in Table #3, the value of "SSS" is simply the data stability condition "SS" (also see FIG. 3C), such that the stability condition of the enablement of the register 312 may be based on the stability condition of the input to the register 312.

In one embodiment, an unrelated enable local_en that does not satisfy the logical relationships with the data stability condition "SS" may be present. In such a case, identifying a stable condition of an enable signal utilizing a data input stability condition, as described above with respect to FIG. 3B, may not necessarily provide an accurate result. In other words, simply because the "SS" condition is true may not necessarily imply whether the "SSS" signal is true or false. This is because the data input value may be stable around the clock cycles when the local_en signal changes, but may not necessarily be stable during the time when the local_en is off. Thus, a new stable value may be captured in the first clock cycle subsequent to when the local_en becomes high. In such an embodiment, a register 332 (see FIG. 3D) may be utilized to ensure that stable input does not change across the time when the additional gating is performed using the "SSS" signal.

Table #4 illustrates one example of code that may be utilized for identifying a stable condition of an enable signal utilizing the register 332. Of course, it should be noted that such code is set forth for illustrative purposes only, and thus should not be construed as limiting in any manner.

TABLE #4

```
always @(posedge clk)
  if (local_en && !SSS )
    F <= F.d
  if (!SSS)
    Sflop <=local_en /*additional capture flop (e.g. item 332 of
FIG. 3D)*/
assign SSS = Sflop & SS
```

Figure 3D:
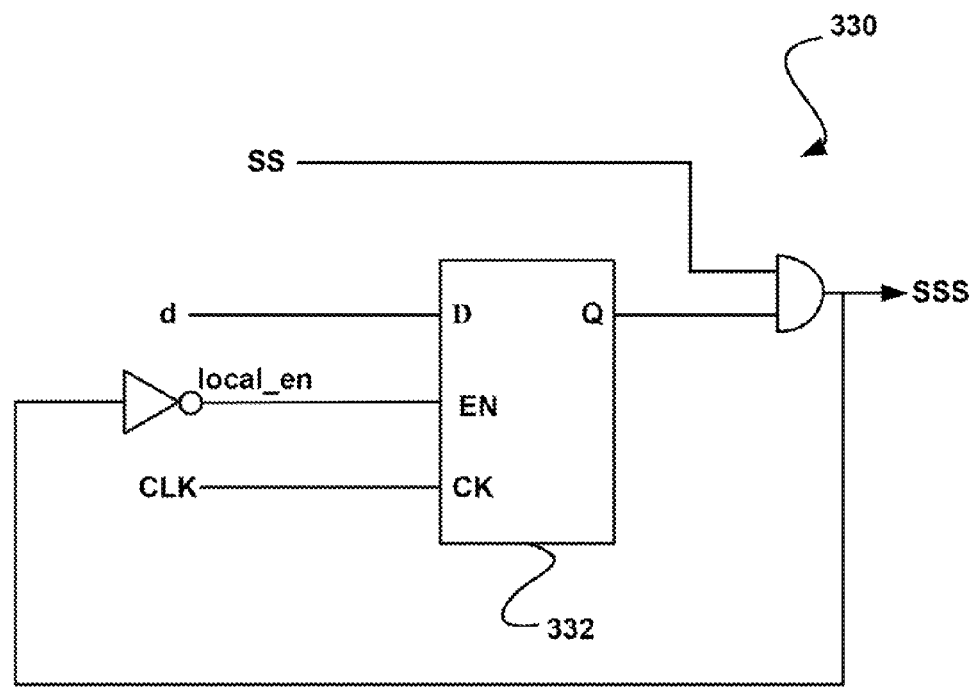
FIG. 3D shows a system for generating a stability-based enable signal SSS for a conditionally enabled register based on the stable condition SS of its data input, in accordance with yet another embodiment.
Figure 3E:
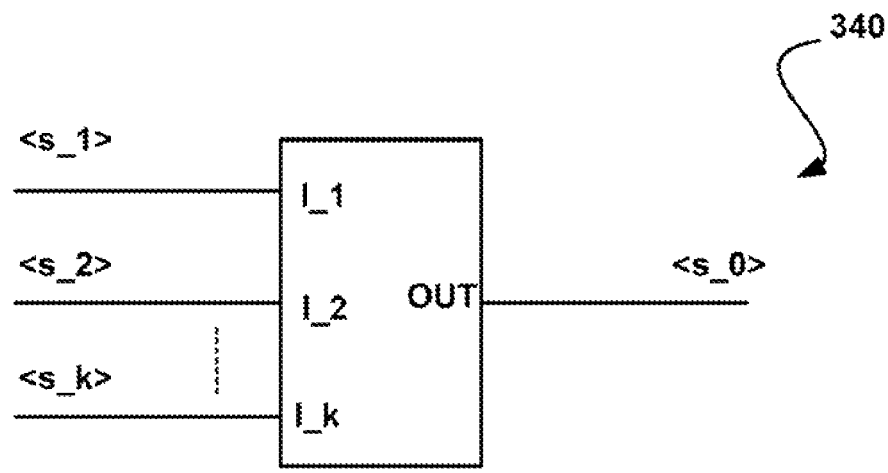
FIG. 3E shows a k-input logic gate where each input has a known stable condition $<s\_i>$, in accordance with another embodiment.
Figure 3F:
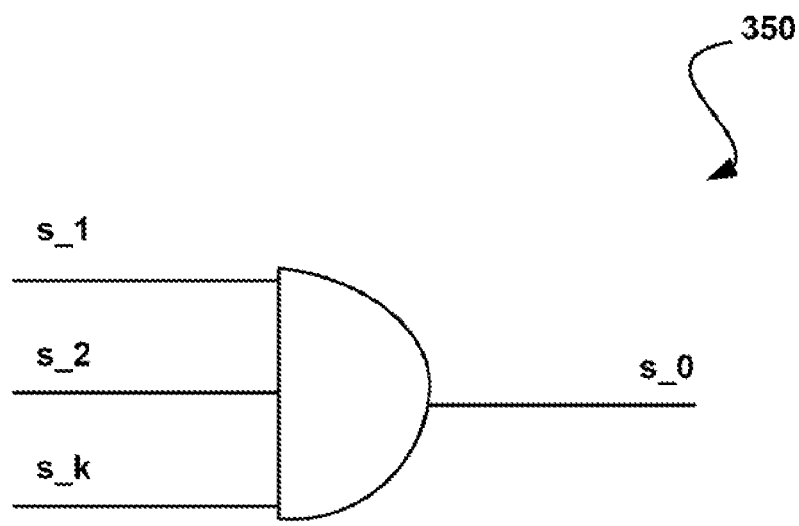
FIG. 3F shows a logic condition in which the input stability condition of the output of a logic gate is set to the Boolean intersection of all of the input stability conditions, in accordance with yet another embodiment.
Figure 3G:
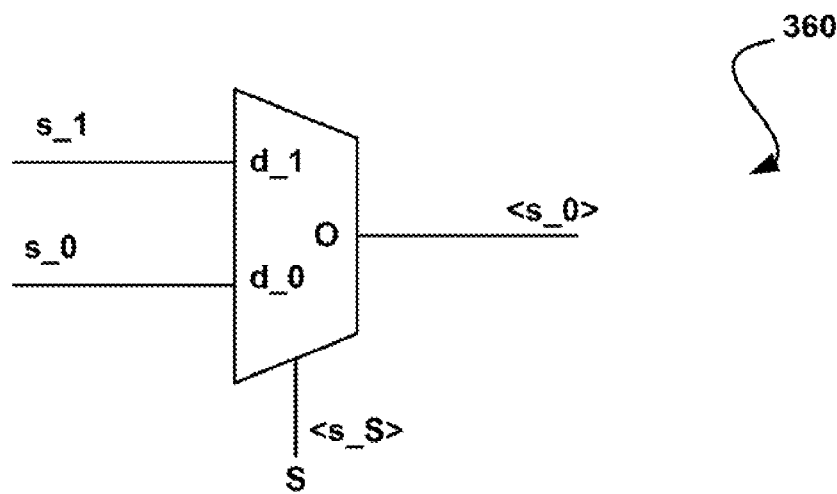
FIG. 3G shows a system that includes a 2 input multiplexer with stable conditions for data inputs, in accordance with still yet another embodiment.
Figure 3H:
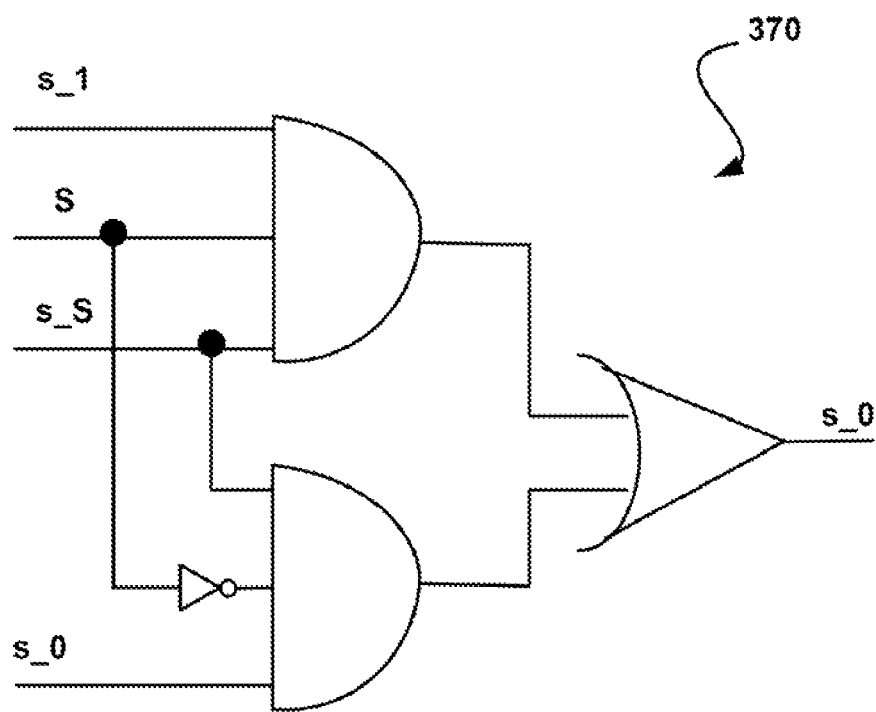
FIG. 3H shows a logic condition in which a stability condition is output from a 2 input multiplexer, in accordance with yet another embodiment.
Figure 3I:
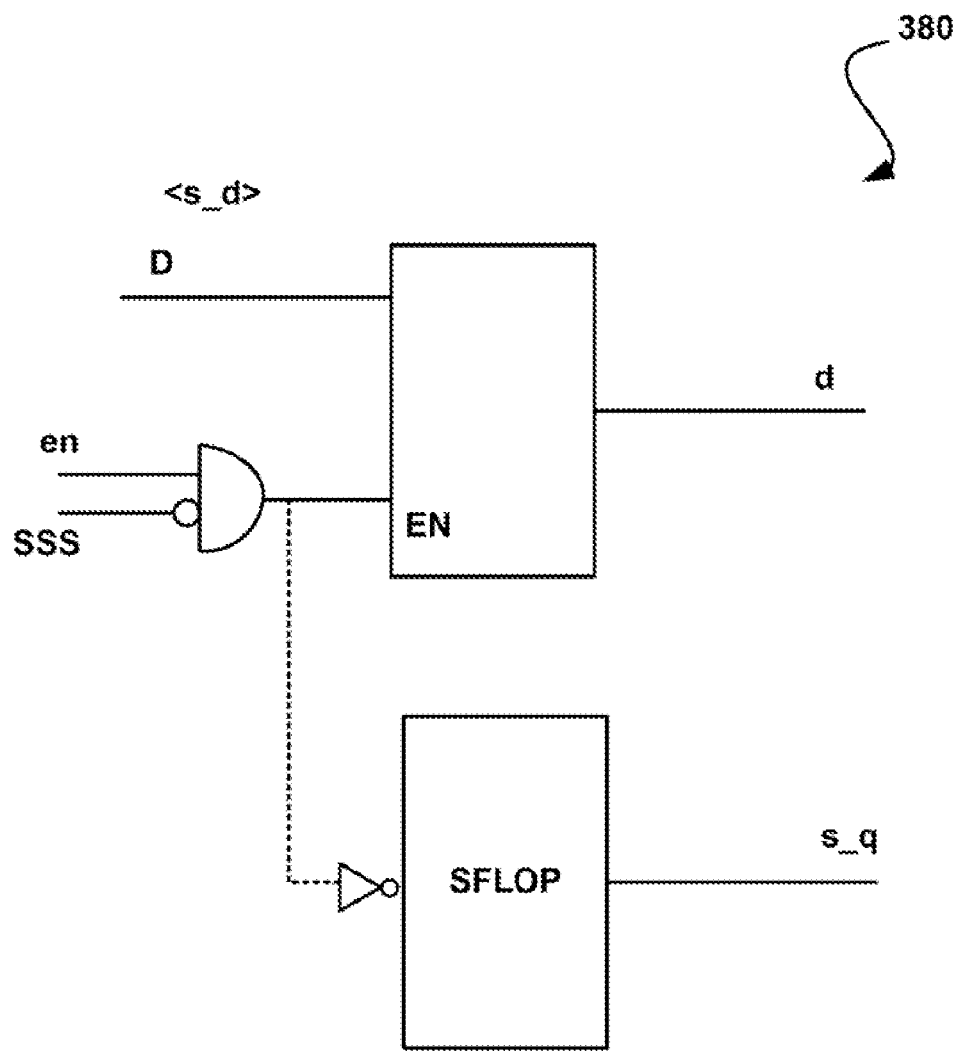
FIG. 3I shows a logic condition in which the stability condition for output of a register is delayed one clock cycle, in accordance with another embodiment.

FIG. 3D shows a system 330 for generating a stability-based enable signal "SSS" for a conditionally enabled register based on the stable condition "SS" of its data input, in accordance with the description in Table #4. As an option, the system 330 may be implemented in the context of the details of FIGS. 1-3C. Of course, however, the system 330 may be implemented in any desired environment.

As shown in Table #4, the capture flop (Sflop) may be true only when the related register (F) is written into the first time. Furthermore, the capture flop may be reset each time an input signal is subsequently not stable, whereas the enable condition for the flip flop may be disabled, or OFF. Thus, the additional register may be utilized to generate the "SSS" signal based on the "SS" signal and the local_en signal, as shown in Table #4. Furthermore, such "SSS" signal may be utilized for determining whether the register F may be disabled (e.g. when the input signal is stable and the local enable signal is otherwise on).

In another embodiment (not shown), the stability for the input of the flip flop may be associated with the signal being constant. In such an embodiment, the capture flop, as described above with respect to Table may not necessarily be utilized since the constant nature of the stability condition implies that the same value will be written each time the stable condition is true. To this end, the embodiment described above with respect to FIG. 3C may be applied in such a case.

in another optional embodiment, the input stability condition ("SS") may be iteratively propagated from inputs towards outputs, as described above with respect to FIG. 1. For example, input stability conditions may be propagated towards primary outputs utilizing a topological ordering. In this way, input stability conditions for all nets driven by a particular node may be evaluated after an input stability condition for all nets in a transitive fanin of the node have been evaluated.

In the context of the present description, the netlist may include connectivity information associated with an electrical design. Further, the nodes may include nets that are representative of the connections of the electrical design. Still yet, the fanin of a particular node may include the various inputs of such node.

Further, the input stability conditions may be initialized. In one embodiment, an input stability condition of all constant signals (e.g. stable signals) may be set to the Boolean condition "true." In another embodiment, an input stability condition of particular signals of interest (e.g. predetermined signals) may be set with a generated condition. For example, such generated condition may include a stability condition, and may thus be identified by comparing a current input value of a flip flop with a previous input value of the flip flop (e.g. utilizing an XNOR operation), as described above with respect to FIG. 2B.

In yet another embodiment, feedback nets within the netlist may be assigned an input stability condition of "0." In this way, the netlist may be rendered acyclic for the purpose of input stability condition propagation even in situations where there are sequential cycles present, as described in more detail below. In still yet another embodiment, the input stability condition for remaining nets may be set to a NULL value (e.g. not assigned).

Once initialized, the nodes may be processed in a topological order until all nets are assigned a non-NULL value. For the output net of any logic node (e.g. AND, OR, XOR, etc.), an associated output may have a non-zero input stability condition only when all inputs have non-zero input stability conditions. In such embodiment, the input stability condition of the output may be set to the Boolean intersection of all of the input stability conditions. Just by way of example, with respect to a general k-input logic gate, if the stability conditions for the inputs include s_1, s_2 ... s_k, then the stability condition for the output so may be expressed as s_1 & s_2 & ... s_k. (See FIGS. 3E and 3F)

For the output of any steering node (e.g. MUX), such output may have a non-zero input stability condition only for those conditions when the select signal is stable and a stable input has been selected. Accordingly, the output input, stability condition may be the logical AND of the select stable condition, the select value, and the stability condition for the selected data input. For example, with respect to a 2-input MUX with a select signal S, with value "0" selecting data input d_0, and value "1" selecting data input d_1 (See FIG. 3G), the stability condition for the output may be expressed by the netlist (See FIG. 3H) where s_S, s_0, and s_1 are the stability conditions for the inputs S, d_0 and d_1 respectively.

Still yet, for any sequential node, s_d may be the stability condition associated with the data input (e.g. such as the signal "SSS" as described above with respect to FIG. 3D). In addition, en may be a preexisting local enable condition. To this end, the stability condition for the output <s_q> may be a 1-clock cycle delayed version of the function !(!SSS & en) (See FIG. 3I).

Figure 4:
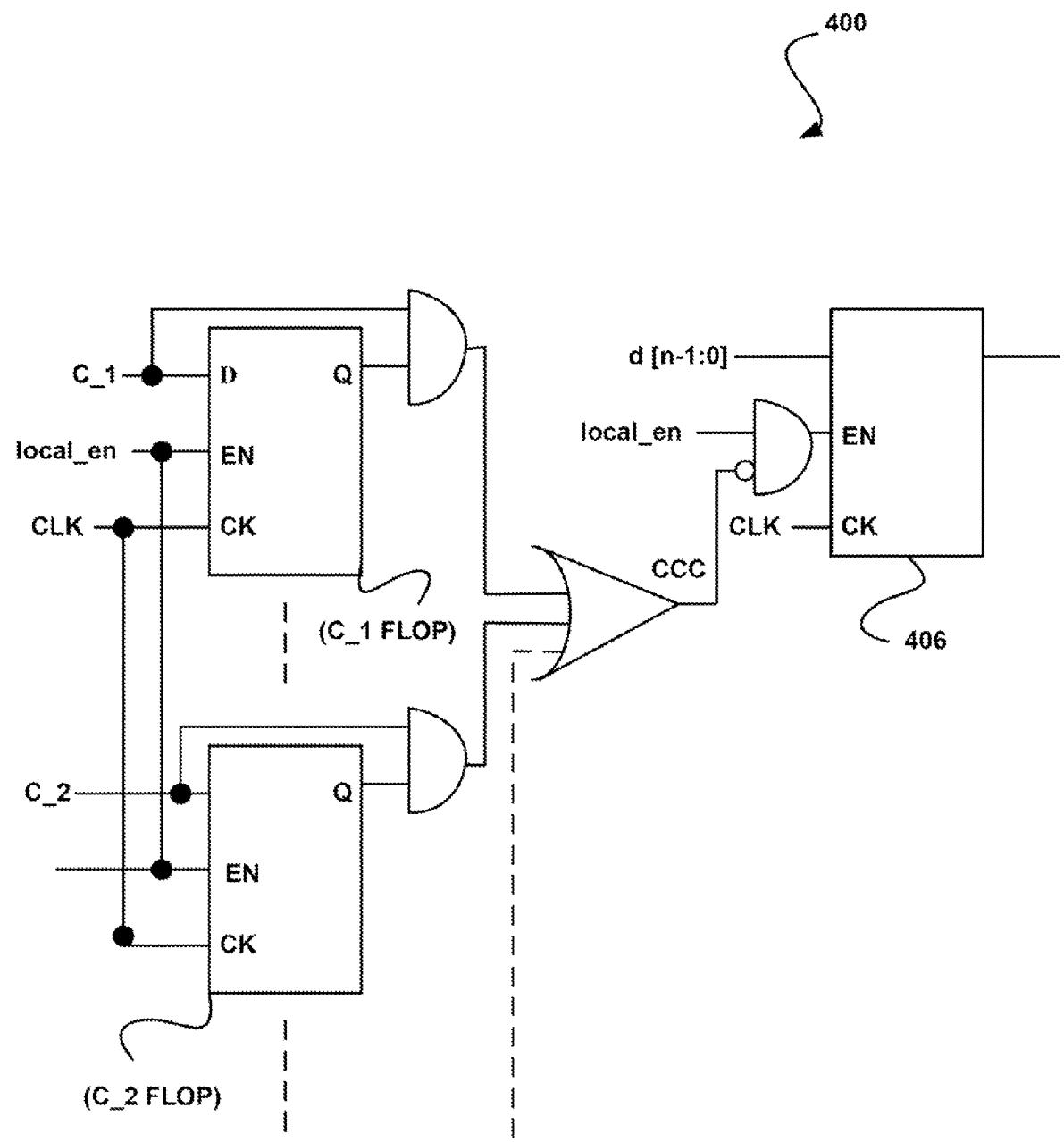
FIG. 4 shows a system for generating a stable enable signal for a conditionally enabled register utilizing conditional constant data inputs, in accordance with another embodiment.

FIG. 4 shows a system 400 for identifying a stable condition of an enable signal utilizing conditional constant data inputs, in accordance with another embodiment. As an option, the system 400 may be implemented in the context of the details of FIGS. 1-3D. Of course, however, the system 400 may be implemented in any desired environment. Further, the aforementioned definitions may equally apply to the description below.

With respect to one embodiment, a stable condition of an enable signal may be identified utilizing knowledge that if the condition "CC" is true then the data input of a register (e.g. the register 302 as shown in FIG. 3M will always be the same value. Further, a stable signal for the flop may be generated by determining if the constant holds over a write cycle (e.g. using a circuit similar to the one presented in FIG. 2B for a single bit signal such as "CC"). In addition, the determination may be used to generate a present cycle gating condition "CCC" for the register.

Table #5 illustrates exemplary code for generating a cycle gating condition for a register. It should be noted that such code is set forth for illustrative purposes only, and thus should not be construed as limiting in any manner.

TABLE #5

```
always @(posedge clk)
  if (local_en)
    F <= data
//can be transformed into
always @(posedge elk) begin
  if (local_en & !CCC) // additional gating function (CCC)
    F <= data
```

Table #6 illustrates exemplary code for generating as stability condition for the constant condition "CC." Such code may be utilized in lieu of comparing actual data values, in one embodiment. It should be noted that such code is set forth for illustrative purposes only, and thus should not be construed as limiting in any manner.

TABLE #6

```
always @(posedge clk)
  if (local_en)
    Cflop <= CC // constant capture flop
  assign CCC = CC & Cflop; // stable after first write
```

The conditional constant data inputs may also be utilized, as described above, in a situation where multiple constants (C_1, C_2) are capable of being assigned to a register 406 under Boolean conditions (CC_1, CC_2, ... ). Table #7 illustrates code for generating the gating signal "CCC". Again, it should be noted that such code is set forth for illustrative purposes only, and should not be construed as limiting in any manner.

TABLE #7

```
always @(posedge clk)
  if (local_en) begin
    C_1flop <= CC_1 // constant capture flop
    C_2flop <= CC_2 // constant capture flop
    ...
  end
  assign CCC_1 = CC_1 & C_1flop; // stable after first write
  assign CCC_2 = CC_2 & C_2flop; // stable after first write
  ...
  assign CCC = CCC_1 || CCC_2 || ... ;
```

As an option, constant value conditions (e.g. Boolean conditions under which a certain related signal always takes on a specific constant value) may be propagated from inputs towards outputs. For example, constant value conditions may be propagated towards primary outputs utilizing a topological ordering, as is set forth below.

In one embodiment, the constant value conditions of signals may be initialized. For example, the constant value conditions of all constant signals may be set as the Boolean condition "true." In addition, feedback nets within a netlist may be assigned a constant value condition of "0." Thus, the netlist may be rendered acyclic for the purpose of constant value condition propagation if there are sequential cycles present, as described in more detail below. Further, the constant value conditions may be set to "0" for all primary inputs, and the constant value conditions for all remaining nets may be set to a NULL value (e.g. unassigned).

In another embodiment, the nodes may be processed in topological order until all nets are assigned a non-NULL value. With respect to the output net of any logic node (e.g. AND, OR, XOR), the output may have a constant value condition only if one or more inputs have dominating constant assignments. Just by way of example, in one embodiment, with respect to a 2-input AND gate, a constant condition C_0A which results in one of the inputs getting a value "0," is sufficient to propagate a constant value of "0" to the output under the same condition C_0A. However, to get a constant value of "1" on the output, it may optionally be required that a condition be present which results in the constant assignment of "1" to both the inputs. Thus, in such embodiment, the constant condition for the output for value "1" may be C_1A & C_1B (where C_1A is the condition for the input A to have a constant value "1" and C_1B is the condition for the input B to have a constant value "1").

For the output of any steering node (e.g. MUX), the output may have a constant value based on the value of a select signal and constant value conditions on the data inputs. For example, with respect to a 2-input MUX with a select signal "S", with value "0" selecting data input d_0, and value "1" selecting data input d_1, the constant value condition for the output out may be expressed as "S .and. CC_1" for constant value c_1 and "S'.and.CC_0" for constant value c_0; where CC_0, and CC_1 are the constant value conditions for the inputs d_0 and d_1 with corresponding constant values c_0 and c_1 respectively. The above can be generalized for multi-input muxes.

Still yet, for any sequential node, where c_d is the condition associated with the data input for value X (e.g. signal "CCC" as shown in FIG. 4) and en is a preexisting local enable condition, the constant condition for the output edge for value "X" may be a 1-clock cycle delayed version of the function !(!CCC & en).

In yet another embodiment, conditions e.g. "CCC" and/or "SSS" conditions) generated from constant value conditions and stable enable conditions may be filtered based on signal probability. For example, in some cases, the identified conditions, as described above with respect to FIGS. 3A-D and within the present description of FIG. 4, may be particularly complex. Also, with respect to conditional constants, there may be numerous conditions that are generated. Thus, for practical purposes, the propagation and manipulation of conditions may be limited, so as to yield a maximum benefit. Such maximum benefit may include a maximum power savings capable of being achieved, by disabling flip flops associated with such conditions. In the context of generating conditions with the express intent of using such conditions to limit switching activity, it may be possible to use heuristic techniques for filtering such conditions.

One particular filter may include using a probability of the select value of a steering node (e.g. MUX) to only propagate conditions that are identified to be true for many clock cycles. Such probabilities may be identified via functional simulation runs.

As another option, the eventual function may be expressed as a sum of products expression. To this end, by evaluating the probability of each minimum term in the condition, only resultant useful ones may be retained.

In yet another embodiment, a particular sequential electrical design may have a specific reset sequence that is applied during, power-on and initializes all registers to known initial values. In the case of the flip flops described hereinabove, it may be necessary that they do not play any role in shutting off activity during such reset sequence. Thus, it may be necessary to maintain the flip flops at a logically inactive or zero state during, and also in the first clock cycle following reset. For example, a ResetActive signal may be generated which is a logical value of "1" during the reset period, and which is also a logical value of "0" thereafter. Such ResetActive signal may be used to tie to the reset pins of all additional flip flops introduced. In some cases, logical designs may already utilize such a signal, but for others the signal may be constructed, utilizing the start of the reset and a counter. It may also be possible to combine both asynchronous and synchronous styles of reset for the additional logic flops introduced.

Figure 5:
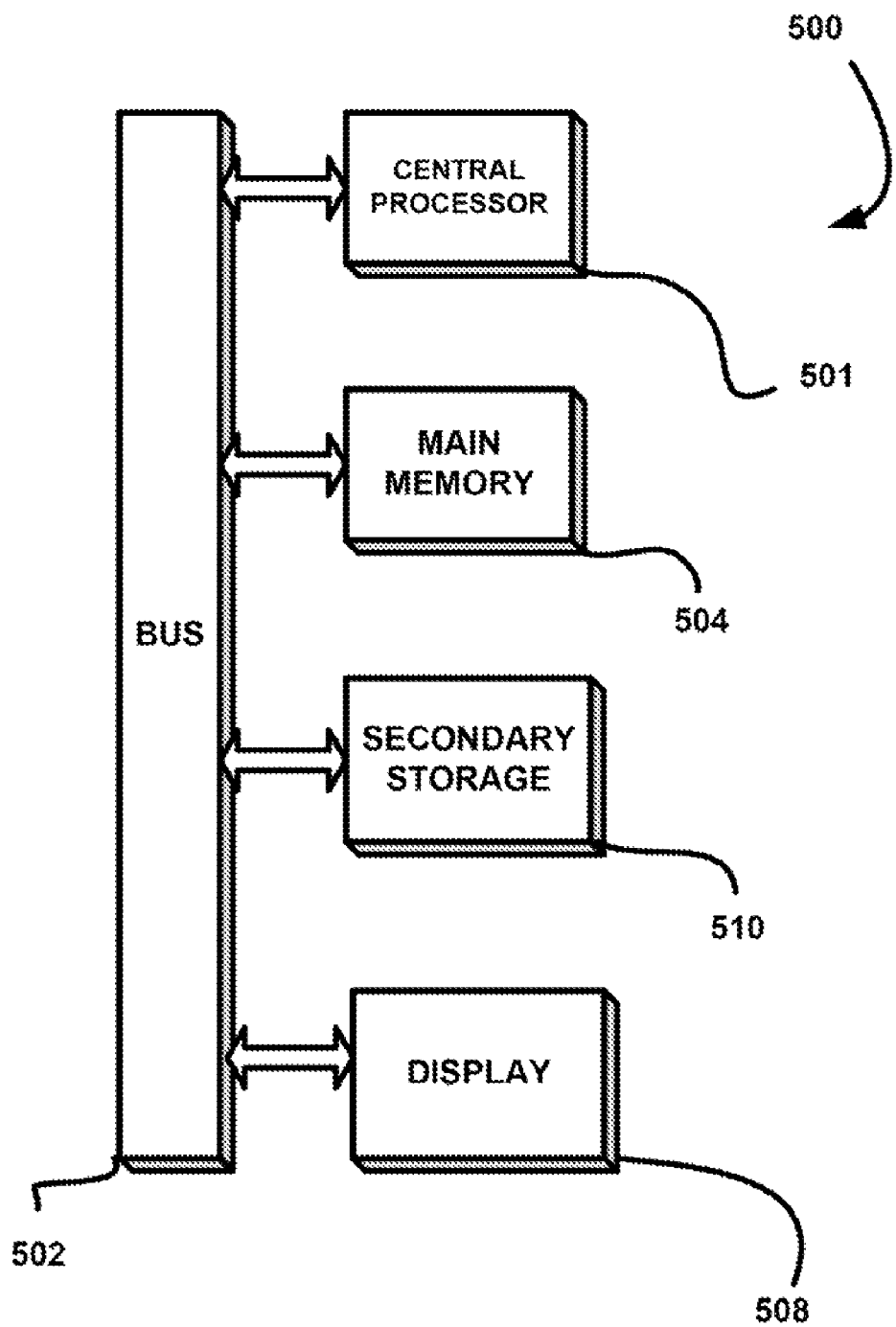
FIG. 5 illustrates an exemplary system, in accordance with one embodiment.

FIG. 5 illustrates an exemplary system 500 with which the various features of any of FIGS. 1-4 may be implemented, in accordance with one embodiment. Of course, the system 500 may be implemented in any desired environment.

As shown, a system 500 is provided including at least one central processor 501 which is connected to a communication bus 502. The system 500 also includes main memory 504 [e.g. random access memory (RAM), etc.]. The system 500 also includes a display 508.

The system 500 may also include a secondary storage 510. The secondary storage 510 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 504 and/or the secondary storage 510. Such computer programs, when executed, enable the system 500 to perform various functions. Memory 504, storage 510 and/or any other storage are possible examples of computer-readable media.

In one embodiment, such computer programs may be used to carry out the functionality of the previous figures. Further, in other embodiments, the architecture and/or functionality of the various previous figures may be implemented utilizing the host processor 501, a chipset (i.e. a group of integrated circuits designed to work and sold as a unit for performing related functions, etc.), and/or any other integrated circuit for that matter.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:
1. A method, comprising:
identifying at least one condition where an output of a logic element before receipt of a clock signal is the same as the output of the logic element after receipt of the clock signal, utilizing a processor; and
disabling the logic element based on the identified condition;

wherein the at least one condition includes a stability condition that is propagated for sequential clock cycles from the output of the logic element to at least one input of at least one logic element.

2. The method of claim 1, wherein the logic element includes at least one of a flip flop, a register, and a memory element.

3. The method of claim 1, wherein the condition is one where an input of the logic element remains unchanged for a first clock cycle and a subsequent number of clock cycles.

4. The method of claim 3, wherein the logic element is disabled during the subsequent number of clock cycles when the input remains unchanged.

5. The method of claim 1, wherein the condition is one where a data input of the logic element remains unchanged for a first clock cycle and a subsequent number of clock cycles, and a pre-existing enable input exists which controls when data is written into the logic element.

6. The method of claim 5, wherein the logic element is disabled during the subsequent number of clock cycles after the first clock cycle in which the pre-existing enable input exists.

7. The method of claim 1, wherein additional logic is included for identifying a condition where an input of the logic element remains unchanged for a first clock cycle and a subsequent second clock cycle.

8. The method of claim 1, wherein the stability condition is propagated from the output of the logic element to the at least one input of the at least one logic element, utilizing a topological ordering.

9. The method of claim 1, wherein an input includes a constant value when the input of the logic element remains unchanged for a first clock cycle and a subsequent number of clock cycles.

10. The method of claim 9, wherein a plurality of the constant inputs are propagated from a plurality of outputs to a plurality of inputs.

11. The method of claim 10, wherein the constant inputs are propagated from the plurality of outputs to the plurality of inputs, utilizing a topological ordering.

12. The method of claim 10, wherein the constant inputs are propagated from the plurality of outputs to the plurality of inputs, utilizing probabilities.

13. The method of claim 1, wherein the logic element is maintained at a predetermined state during a reset operation.

14. The method of claim 1, wherein additional hardware is utilized to save a state of the clock signal in a first cycle and compare the state with a subsequent state of the clock signal in a subsequent second cycle.

15. The method of claim 1, wherein an XNOR gate receives and stores a single bit input signal associated with the clock signal, receives and stores a second single bit input signal associated with a subsequent second clock signal, and identifies a stability of the single bit input signal and the second single bit input signal.

16. The method of claim 1, wherein when the stability condition is propagated for the sequential clock cycles from the output of the logic element to the at least one input of the at least one logic element, a write is identified as redundant and a loading of the logic element that includes a register is prevented with respect to a current clock cycle.

17. A computer program product embodied on a non-transitory computer readable medium, comprising:
   computer code for identifying at least one condition where an output of a logic element before receipt of a clock signal is the same as the output of the logic element after receipt of the clock signal; and
   computer code for disabling the logic element based on the identified condition;
   wherein the computer program product is operable such that the at least one condition includes a stability condition that is propagated for sequential clock cycles from the output of the logic element to at least one input of at least one logic element.

18. The computer program product of claim 17, wherein the logic element includes at least one of a flip flop, a multiplexer, an AND gate, and an OR gate.

19. The computer program product of claim 17, wherein the condition is one where an input of the logic element remains unchanged for a first clock cycle and a subsequent number of clock cycles.

20. The computer program product of claim 19, wherein the logic element is disabled during the subsequent number of clock cycles.

21. A system, comprising:
   means for identifying at least one condition where an output of a logic element before receipt of a clock signal is the same as the output of the logic element after receipt of the clock signal; and
   means for disabling the logic element based on the identified condition;
   wherein the system is operable such that the at least one condition includes a stability condition that is propagated for sequential clock cycles from the output of the logic element to at least one input of at least one logic element.

22. A method, comprising:
   determining an output of a logic element before receipt of a clock signal, utilizing a processor;
   determining the output of the logic element after receipt of the clock signal; and
   disabling the logic element for a condition where the output of the logic element before receipt of the clock signal is the same as the output of the logic element after receipt of the clock signal;
   wherein the at least one condition includes a stability condition that is propagated for sequential clock cycles from the output of the logic element to at least one input of at least one logic element.

23. A method, comprising:
   identifying at least one condition where an input of a logic element before receipt of a clock signal is a known constant value and is the same as an output of the logic element during receipt of the clock signal, utilizing a processor; and
   disabling the logic element based on the identified condition;
   wherein at least one condition includes a stability condition that is propagated for sequential clock cycles from the output of the logic element to at least one input of at least one logic element.

* * * * *